United States Patent [19]
Lui et al.

[11] Patent Number: 5,818,778
[45] Date of Patent: *Oct. 6, 1998

[54] REDUNDANCY CIRCUIT FOR PROGRAMMABLE INTEGRATED CIRCUITS

[75] Inventors: Sik K. Lui, Sunnyvale; Raymond M. Chu, Saratoga; David J. Pilling, Los Altos Hills, all of Calif.

[73] Assignee: Integrated Device Technology, Inc., Santa Clara, Calif.

[ * ] Notice: The term of this patent shall not extend beyond the expiration date of Pat. No. 5,678,888.

[21] Appl. No.: 824,591

[22] Filed: Mar. 26, 1997

Related U.S. Application Data

[63] Continuation of Ser. No. 473,041, Jun. 6, 1995, Pat. No. 5,677,888.

[51] Int. Cl.$^6$ .................................................. G11C 17/16
[52] U.S. Cl. .................... 365/225.7; 365/96; 365/189.09
[58] Field of Search ............................ 365/225.7, 189.09, 365/96, 189.01

[56] References Cited

U.S. PATENT DOCUMENTS

| | | | |
|---|---|---|---|
| 5,119,163 | 6/1992 | Ishihara et al. | 365/96 |
| 5,172,337 | 12/1992 | Iwase et al. | 365/96 |
| 5,208,780 | 5/1993 | Iwase et al. | 365/96 X |
| 5,257,230 | 10/1993 | Nobori et al. | 365/96 X |
| 5,426,614 | 6/1995 | Harward | 365/225.7 |
| 5,444,650 | 8/1995 | Abe et al. | 365/225.7 X |
| 5,448,187 | 9/1995 | Kowalski | 365/225.7 X |
| 5,469,396 | 11/1995 | Eltoukhy | 365/225.7 X |
| 5,495,181 | 2/1996 | Kolze | 365/96 X |
| 5,495,436 | 2/1996 | Callahan | 365/225.7 X |

*Primary Examiner*—Do Hyun Yoo
*Attorney, Agent, or Firm*—Skjerven, Morrill, MacPherson, Franklin & Friel

[57] ABSTRACT

An antifuse redundancy circuit operates with transparency to external circuitry and users. In one embodiment, an antifuse redundancy circuit incorporates two antifuses rather than one. The circuit is arranged so that both antifuses may be simultaneously programmed and read. If a single antifuse is programmed without programming the other antifuse, the antifuse redundancy circuit will register a programmed antifuse. Additionally, if a single programmed antifuse is unintentionally deprogrammed after both antifuses in the redundancy circuit have been programmed, the antifuse redundancy circuit will continue to register a programmed antifuse. The result is both an increase in manufacturing yield and an increase in the reliability of integrated circuits utilizing antifuses.

19 Claims, 1 Drawing Sheet

REDUNDANCY CIRCUIT FOR PROGRAMMABLE INTEGRATED CIRCUITS

This application is a continuation of application Ser. No. 08/473,041, filed Jun. 6, 1995 now U.S. Pat. No. 5,677,888.

FIELD OF THE INVENTION

This invention relates to programmable integrated circuits and more particularly to a redundancy circuit for antifuses.

BACKGROUND

Redundancy has long been used to improve yields of semiconductor devices. In integrated circuits redundancy has been utilized to reduce the effect of problems caused by defects introduced during the manufacturing process. For example, in semiconductor memories, manufacturers may equip memory arrays with one or more spare rows or columns of memory cells. Typically, completed memory cells are tested to detect defective rows or columns wherein a single defective memory cell in a row or column renders the entire row or column defective. A spare row or column may be selectively substituted for such a defective row or column.

When antifuses are located in critical operating areas of an integrated circuit such as microprocessor circuits, logic circuits, and field programmable gate arrays, a single defective antifuse or an unintentionally programmed or deprogrammed antifuse can render defective an entire integrated circuit. This can severely reduce manufacturing yields and reliability and increase costs.

An antifuse circuit element used in integrated circuits is a resistive fuse component which in the unprogrammed state has a very high (i.e. at least hundreds of megaohms) impedance but which when programmed has a low impedance, typically on the order of a few hundred ohms. The antifuse is programmed by applying a programming voltage, larger in magnitude than normal operating voltages, for a sufficient time across the terminals of the antifuse. An antifuse may include a sandwich of thin film dielectric materials such as silicon dioxide, silicon nitride, and silicon dioxide (sometimes called "ONO" for "oxide-nitride-oxide") disposed between two conductors, or the antifuse may comprise a layer of undoped amorphous silicon between two conductors.

The integrity of the antifuse in both its programmed and unprogrammed states is adversely affected by several factors. For example, elevated operating temperatures of the integrated circuit associated with current flowing through a programmed antifuse or a continuous voltage bias across and current flow through the antifuse may degrade the conductivity of a programmed antifuse over time causing a deleterious change in the operation of the circuit containing the antifuse. Furthermore, a continuous voltage applied across the terminals of an unprogrammed antifuse during normal operating conditions may disadvantageously program the unprogrammed antifuse.

When used in a memory array, an antifuse is to be selected for programming by well-known decoding methods. When the external programming voltage is applied across an antifuse selected to be programmed, non-selected antifuses may be subjected unintentionally to the programming voltage and thus unintentionally programmed. Conversely, subjecting antifuses to lower voltages during frequent read operations, may result in the unintentional programming or deprogramming of an antifuse.

Furthermore, a defective antifuse may fail to program during its programming cycle thereby causing the circuit incorporating the defective antifuse to possibly malfunction.

SUMMARY OF THE INVENTION

The present invention provides an antifuse redundancy circuit whose operation is transparent to external circuitry and users.

In one embodiment of the present invention, an antifuse redundancy circuit incorporates two antifuses rather than one. The circuit is arranged so that both antifuses may be simultaneously programmed and read. If a single antifuse is programmed without programming the other antifuse, the antifuse redundancy circuit will register a programmed antifuse. Additionally, if a single programmed antifuse is unintentionally deprogrammed after both antifuses in the redundancy circuit have been programmed, the antifuse redundancy circuit will continue to register a programmed antifuse.

The result is both an increase in manufacturing yield and an increase in the reliability of integrated circuits utilizing antifuses.

DETAILED DESCRIPTION

Figure 1:
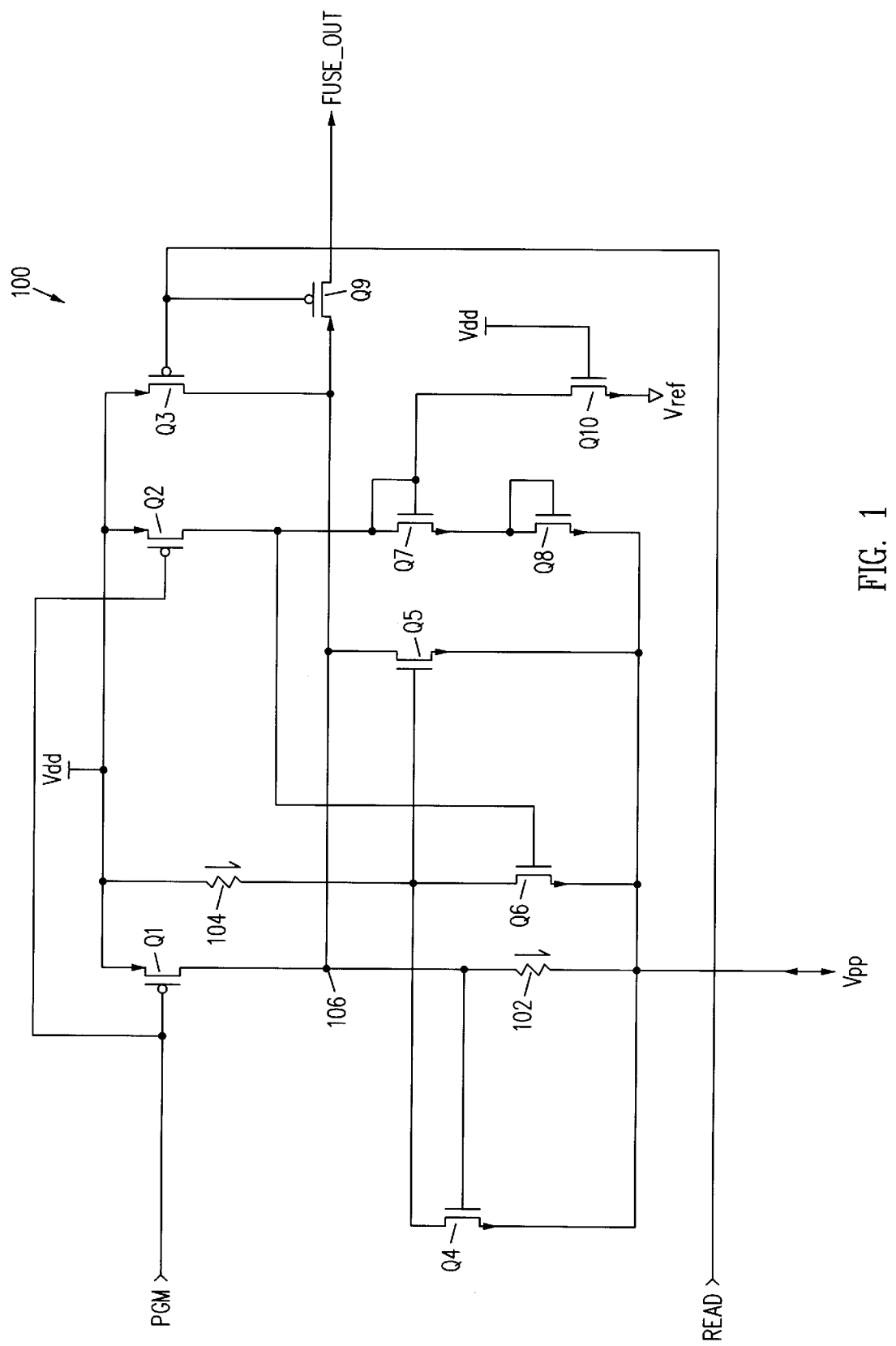
FIG. 1 illustrates a schematic diagram of one embodiment of the antifuse redundancy circuit of this invention.

The following description of this invention is intended to be illustrative only and not limiting.

Antifuses used in typical integrated circuit applications such as in memories, microprocessors, and field programmable gate arrays are typically organized into one or more arrays or orderly addressable arrangements. In either case, antifuses are selected for programming by a select circuit or other decoders of well known design. During programming, a programming voltage is selectively and sequentially applied across each antifuse designated to be programmed. Non-designated antifuses are protected from the programming voltage to prevent unintentional programming. Typically a variable voltage source is coupled to an external programming pin which is coupled to a node of the antifuse being programmed to assist in establishing the programming voltage.

In accordance with this invention, the reliability of individual antifuse cells is increased by providing a second, redundant antifuse in each antifuse cell. The programming voltage is applied across both antifuses in one cell simultaneously thereby incurring no additional programming time delays relative to programming a single antifuse. After programming, the antifuse redundancy circuit conveys accurate information to an inquiring sense circuit when at least one of the antifuses is programmed. Additionally, if one of the antifuses is unintentionally deprogrammed after both antifuses in the cell have been programmed, the antifuse redundancy circuit continues to retain correct information corresponding to the state of a programmed antifuse. If one or both of the antifuses in the antifuse redundancy circuit are unintentionally programmed, the antifuse redundancy circuit produces an inaccurate output. However, the probability of one of the antifuses in a cell becoming unintentionally programmed is no greater than the probability of unintentionally programming the single antifuse in a typical antifuse cell.

Referring to FIG. 1, when antifuse redundancy circuit 100 is selected for programming, a select circuit (not shown) applies a low programming voltage signal such as zero volts (0 V) to PGM node ("PGM") and a high voltage signal such as five volts (+5 V) to READ node ("READ"). During programming Vpp is established at a below system ground voltage such as minus five volts (−5 V). The low voltage signal on PGM is applied to the gates of P-channel MOS transistors Q1 and Q2, and Vdd (+5 V) is applied to the sources of transistors Q1 and Q2 thereby causing transistors Q1 and Q2 to conduct.

Initially, the high impedance of unprogrammed antifuse 102 allows little if any programming current to flow through antifuse 102, and a programming voltage of Vdd minus Vpp, less the slight drain-to-source voltage drop (Vds) across transistor Q1, is applied across antifuse 102 for a selected time. In response to this voltage, the resistance of antifuse 102 decreases to a few hundred ohms or less during programming. During programming, Vds across transistor Q1 increases as the resistance of antifuse 102 decreases. The non-linear relationship of Vds versus drain current (Id) for transistor Q1 causes the programming current Id to saturate for some value of Vds.

Simultaneously, diode-coupled N-channel MOS transistors Q7 and Q8 and transistor Q2 establish a positive bias voltage on the gate of N-channel MOS transistor Q6 causing transistor Q6 to conduct. Antifuse 104 is programmed identically to antifuse 102 with transistor Q6 limiting the programming current to antifuse 104 in the same manner as transistor Q1 does for antifuse 102.

During programming, transistor Q1 initially charges the gate of N-channel MOS transistor Q4 to approximately Vdd causing transistor Q4 to conduct. Conducting transistor Q4 pulls the gate of N-channel MOS transistor Q5 to approximately Vpp which prevents transistor Q5 from conducting. As the resistance of antifuse 102 decreases, the gate-to-source voltage of transistor Q4 decreases below the threshold voltage ("Vth") of transistor Q4 to turn Q4 "off" thereby allowing Q5 to turn on as the voltage on the gate of Q5 rises. The voltage on the gate of Q5 rises toward Vdd as antifuse 104 is programmed. Q5 turns on and pulls the voltage on node 106 to Vpp.

Following the simultaneous programming of antifuses 102 and 104, a high voltage such as +5 V is applied to PGM which prevents transistors Q1 and Q2 from conducting. High impedance N-channel MOS transistor Q10 always conducts during normal operation. When transistor Q2 is turned "off", by PGM going high, transistor Q10 discharges the gate of transistor Q6 to $V_{ref}$ thereby turning off Q6 and thus eliminating any voltage drop across antifuse 104 during non-programming conditions. $V_{ref}$ is preferably coupled to a voltage that allows transistor Q10 to conduct such as ground.

An antifuse may become defective due to a variety of reasons. However, if either antifuse 102 or antifuse 104 fail to program during the programming operation or one of them is unintentionally deprogrammed after both have been programmed, antifuse redundancy circuit 100 will continue to provide accurate information during a read operation as explained below.

During a read operation, read output node 106 transfers a logic "1" (3–5 V) to FUSE_OUT node ("FUSE_OUT") if both antifuses 102 and 104 are unprogrammed. If either or both antifuses 102 and 104 are programmed, read output node 106 transfers a logic "0" (0–2 V) to FUSE_OUT, otherwise read output node 106 transfers a logic "1" to FUSE_OUT.

The read operation is initiated by a select circuit (not shown) applying a read voltage of 0 V to READ, switching Vpp to system ground, and applying +5 V to PGM. The read voltage is applied to the gates of P-channel MOS transistors Q9 and Q3 causing Q9 and Q3 to conduct. The +5 V on PGM turns transistors Q1 and Q2 "off".

During the read operation, if both antifuses 102 and 104 are unprogrammed and thus non-conductive, read output node 106 charges to approximately a logic "1" through transistor Q3. The logic "1" on read output node 106 applied to the gate of transistor Q4 causes transistor Q4 to conduct. Vpp (corresponding to system ground) is applied to the gate of transistor Q5 through transistor Q4 which prevents transistor Q5 from conducting. Thus, read output node 106 remains at logic "1". P-channel MOS pass transistor Q9 transfers the logic "1" on read output node 106 to FUSE_OUT.

During the read operation, if both antifuses 102 and 104 are programmed, the resistance of programmed antifuse 102 is sufficiently low to cause a relatively large Vds drop across conducting transistor Q3 causing read output node 106 to assume a logic "0". The logic "0" on read output node 106 prevents transistor Q4 from conducting. A negligible voltage drop occurs across programmed antifuse 104 causing transistor Q5 to conduct. Conducting transistor Q5 pulls read output node 106 to an even lower voltage, approximately ground on Vpp. Pass transistor Q9 transfers the logic "0" on read output node 106 to FUSE_OUT.

If antifuse 102 is intentionally programmed and antifuse 104 is defective and cannot be programmed or has been unintentionally deprogrammed, antifuse redundancy circuit 100 continues to provide the correct logic "0" output to FUSE_OUT during the read operation. As discussed above, the programmed antifuse 102 causes read output node 106 to assume a logic "0". Nonconducting transistor Q4 and unprogrammed antifuse 104 eliminate any discharge or charging paths for the gate of transistor Q5 causing the gate of transistor Q5 to "float". If the gate voltage of transistor Q5 is below the threshold voltage, Vth of transistor Q5, transistor Q5 is "off", and pass transistor Q9 transfers the logic "0" on read output node 106 to FUSE_OUT. If the gate-to-source voltage of transistor Q5 exceeds Vth of transistor Q5, transistor Q5 conducts and brings read output node 106 to an even lower voltage corresponding to ground on Vpp. Pass transistor Q9 transfers the correct logic "0" on read output node 106 to FUSE_OUT.

If antifuse 104 is intentionally programmed and antifuse 102 is defective and cannot be programmed or has been unintentionally deprogrammed, antifuse redundancy circuit 100 continues to provide the correct logic "0" output to FUSE_OUT during the read operation. When antifuse 102 is not programmed, read output node 106 initially charges to approximately Vdd causing transistor Q4 to conduct. Conducting antifuse 104 causes transistor Q5 to conduct. Transistor Q5 is sized to have a lower impedance and a higher conductance than transistor Q3. Thus transistor Q5 discharges read output node 106 to a logic "0". Pass transistor Q9 transfers the logic "0" on read output node 106 to FUSE_OUT.

It will be appreciated by those skilled in the art after reading this description that although N-channel and P-channel MOS transistors are described other switches may be utilized to implement the antifuse redundancy circuit. Accordingly, various other embodiments and modifications and improvements not described herein may be within the spirit and scope of the present invention, as defined by the following claims.

What is claimed is:

1. A circuit comprising:
   an antifuse cell comprising:
      a first antifuse;
      a second antifuse;

an output node to conduct a state of the antifuse cell, wherein the antifuse cell has only a single state during any period of time;

a read node;

a program circuit for coupling a programming voltage across the first and second antifuses; and a read circuit for coupling a read voltage across the first and second antifuses and, in response to a read signal on the read node which selects the antifuse cell, for providing a state of the antifuse cell to the output node which corresponds to a programmed state of the first and second antifuses when both of the first and second antifuses are programmed and corresponds to the programmed state of one of the first and second antifuses if only one of the first and second antifuses is programmed;

wherein when at least one of the first and second antifuses is programmed, the antifuse cell is in a programmed state, the programmed state being the same when one of the first and second antifuses is programmed and when both antifuses are programmed to provide redundancy to the antifuse cell.

2. The circuit as in claim 1 wherein the program circuit includes:

a program terminal;

a voltage bias circuit having a control terminal coupled to the program terminal and a voltage node;

a first PMOS transistor having a source coupled to a first voltage node, a drain coupled to a terminal of the first antifuse, and a gate coupled to the program terminal; and a first NMOS transistor having a source coupled to a second voltage node, a drain coupled to the second antifuse, and a gate coupled to the voltage node of the voltage bias circuit.

3. The circuit as in claim 1 wherein the circuit is an integrated circuit selected from the group consisting of a microprocessor, a memory, and a field programmable gate array.

4. A circuit comprising:

a first voltage node;

a second voltage node;

a first antifuse having a first terminal coupled to the first voltage node and having a second terminal;

a second antifuse having a first terminal coupled to the second voltage node and having a second terminal;

a first switch having current terminals coupled between the first antifuse second terminal and the second voltage node and having a control terminal;

a second switch having current terminals coupled between the second antifuse second terminal and the first voltage node and having a control terminal;

a read output node coupled to the first antifuse second terminal and the second antifuse second terminal;

an output terminal;

a READ signal terminal;

a pass switch having current terminals coupled between the read output node and the output terminal and a control terminal coupled to the READ terminal; and a PROGRAM signal terminal coupled to the first switch control terminal and to the second switch control terminal, wherein the first and second switches conduct when the PROGRAM signal terminal has a program signal.

5. The circuit of claim 4 further comprising:

a third switch having a control terminal coupled to the second antifuse second terminal and having current terminals coupled between the read output node and the second voltage node; and a fourth switch having a control terminal coupled to the first antifuse second terminal and having current terminals coupled between the third switch control terminal and the second voltage node.

6. The circuit of claim 5 wherein the second switch and the pass switch are PMOS field effect transistors and the first, third and fourth switches are NMOS field effect transistors.

7. The circuit of claim 4 wherein the first voltage node is coupled to a +5V voltage reference and the second voltage node is coupled to a −5V voltage reference.

8. The circuit of claim 4 further comprising:

a voltage bias circuit having a control terminal coupled to the PROGRAM terminal, a voltage node coupled to the first switch control terminal, a first current terminal coupled to the first voltage node, and a second current terminal coupled to the second voltage node.

9. The circuit of claim 8 wherein the voltage bias circuit includes:

a third switch having current terminals coupled between the first voltage node and the voltage node of the voltage bias circuit and a control terminal coupled to the PROGRAM terminal;

a fourth switch having a first current terminal and a control terminal coupled to the voltage node of the voltage bias circuit, and a second current terminal; and a fifth switch having a first current terminal and a control terminal coupled to the fourth switch second current terminal and a second current terminal coupled to the second voltage node.

10. The circuit of claim 9 further comprising:

a third voltage node; and a discharge circuit coupled between the voltage bias circuit voltage node and the third voltage node.

11. A circuit having an antifuse cell comprising:

a first antifuse having first and second terminals;

a second antifuse having first and second terminals;

an output node to conduct a state of the circuit wherein the circuit has only a single state during any period of time;

a read node to conduct a read signal that selects both the first and second antifuses;

means for applying a programming voltage across the first and second terminals of both the first and second antifuses to program one or both of the first and second antifuses; and means for determining the state of the circuit at the output node if the read node conducts the read signal, wherein the circuit has the same programmed state when one of the first and second antifuses is programmed and when both of the first and second antifuses are programmed, and a failure of one of the first and second antifuses to program has no effect on the circuit programmed state.

12. A method of programming and reading antifuses in a circuit, the method comprising the steps of:

applying a programming voltage approximately simultaneously across a first antifuse and a second antifuse of an antifuse cell to program at least one of the first and second antifuses, the antifuse cell having only a single state during any period in time and the state of the antifuse cell being the same upon one of the first and second antifuses being programmed and upon both of the first and second antifuses being programmed;

applying a read voltage approximately simultaneously across the first and second antifuses in response to a read signal present on a READ node which selects both the first and second antifuses;

coupling a first potential to a READ OUTPUT node when the first and second antifuses are not programmed; and coupling a second potential to the READ OUTPUT node when only one of the first and second antifuses is programmed and when both the first and second antifuses are programmed so that the first and second antifuses provide redundancy to the antifuse cell.

13. The method as in claim 12 wherein the step of applying a read voltage comprises:

applying a read signal to a switch to couple the first and second antifuses to the READ OUTPUT node.

14. The method as in claim 13 further comprising the step of:

applying the read signal to a pass transistor to couple the READ OUTPUT node to an OUTPUT node.

15. The method as in claim 12 wherein the programming voltage applying step comprises:

applying a program voltage signal to a plurality of field effect transistors so that the programming voltage is applied across the first and second antifuses.

16. A method of programming and reading antifuses in a circuit having an antifuse cell, the method comprising the steps of:

programming a first antifuse and a second antifuse of the antifuse cell approximately simultaneously to place the antifuse cell of the circuit in a programmed state; and reading a state of the antifuse cell of the circuit in response to a read signal on a READ node which selects the first antifuse and the second antifuse, wherein the antifuse cell conveys only a single state to the circuit during a period of time, and the antifuse cell has the same programmed state when one of the first and second antifuses is programmed and when both of the first and second antifuses are programmed.

17. The method as in claim 16 wherein the programming step comprises the steps of:

applying a programming voltage across the first antifuse; and applying a programming voltage across the second antifuse;

wherein at least one of the first and second antifuses is programmed.

18. The method as in claim 16 wherein the reading step comprises the steps of:

applying a reading voltage across the first antifuse;

applying a reading voltage across the second antifuse; and coupling a potential corresponding to the programmed state to a read output node when at least one of the antifuses is programmed.

19. A method of improving the yield and reliability of a circuit having an antifuse cell which includes a first antifuse, the method comprising the steps of:

adding a second antifuse to the antifuse cell; and programming the first and second antifuses to place the antifuse cell in a programmed state;

selecting both the first and second antifuses with a read signal;

providing a single programmed state of the antifuse cell to an output node in response to the read signal, wherein the single programmed state of the antifuse cell is based on the states of the first and second antifuses;

wherein the second antifuse has been added to the antifuse cell in such a manner as to cause the antifuse cell to adopt the same programmed state when the first antifuse alone is programmed, when the second antifuse alone is programmed, and when both the first and second antifuses are programmed.

* * * * *